(12) United States Patent
Uzoh et al.

(10) Patent No.: US 9,905,713 B2
(45) Date of Patent: *Feb. 27, 2018

(54) METHOD AND SUBSTRATES FOR MATERIAL APPLICATION

(76) Inventors: Cyprian Emeka Uzoh, San Jose, CA (US); Emeka Nchekwube, Morgan Hill, CA (US)

(*) Notice: Subject to any disclaimer, the term of this patent is extended or adjusted under 35 U.S.C. 154(b) by 144 days.

This patent is subject to a terminal disclaimer.

(21) Appl. No.: 13/274,218

(22) Filed: Oct. 14, 2011

(65) Prior Publication Data

US 2012/0091387 A1    Apr. 19, 2012

Related U.S. Application Data

(60) Provisional application No. 61/455,060, filed on Oct. 15, 2010, provisional application No. 61/455,061, filed on Oct. 15, 2010.

(51) Int. Cl.
*E04B 1/78* (2006.01)
*B05D 5/12* (2006.01)
(Continued)

(52) U.S. Cl.
CPC .......... *H01L 31/0322* (2013.01); *B32B 18/00* (2013.01); *C04B 35/532* (2013.01); *C04B 35/803* (2013.01); *H01L 31/022425* (2013.01); *H01L 31/03923* (2013.01); *H01L 31/056* (2014.12); *H01L 31/0749* (2013.01); *H01L 31/18* (2013.01); *H02S 20/22* (2014.12); *H02S 40/22* (2014.12); *C04B 2235/3241* (2013.01); *C04B 2235/36* (2013.01); *C04B 2235/404* (2013.01); *C04B 2235/407* (2013.01);
(Continued)

(58) Field of Classification Search
None
See application file for complete search history.

(56) References Cited

U.S. PATENT DOCUMENTS

| 3,791,097 A | 2/1974 | Cassella |
| 3,919,387 A | 11/1975 | Singer |

(Continued)

FOREIGN PATENT DOCUMENTS

| JP | 64-075566 | 3/1989 |
| JP | 07-331536 | 12/1995 |

(Continued)

OTHER PUBLICATIONS

CMMPE, Introduction to Liquid Crystals, University of Cambridge, retrieved Aug. 17, 2016, pp. 1-2.*

(Continued)

*Primary Examiner* — Callie Shosho
*Assistant Examiner* — Patrick English
(74) *Attorney, Agent, or Firm* — Haverstock & Owens LLP

(57) ABSTRACT

A method of and an apparatus for making a composite material is provided. The composite is able to be formed by mixing a binder and a physical property enhancing material to form a mixer. The binder is able to be pitch, such as mesophase pitch. The physical property enhancing material is able to be fiber glass. The mixer is able to be processed through a lamination process, stabilization/cross-link process, and carbonization. The composite material is able to be applied in the field of electronic components and green technology, such as a substrate of a photovoltaic cell.

12 Claims, 6 Drawing Sheets

(51) Int. Cl.

| | | |
|---|---|---|
| *H01B 1/00* | (2006.01) | |
| *H01B 1/04* | (2006.01) | |
| *H01B 1/14* | (2006.01) | |
| *H01B 1/22* | (2006.01) | |
| *H01L 31/032* | (2006.01) | |
| *H01L 31/0224* | (2006.01) | |
| *H01L 31/0392* | (2006.01) | |
| *H01L 31/0749* | (2012.01) | |
| *H01L 31/056* | (2014.01) | |
| *H02S 20/22* | (2014.01) | |
| *H02S 40/22* | (2014.01) | |
| *H01L 31/18* | (2006.01) | |
| *C04B 35/532* | (2006.01) | |
| *B32B 18/00* | (2006.01) | |
| *C04B 35/80* | (2006.01) | |

(52) U.S. Cl.
CPC .. *C04B 2235/422* (2013.01); *C04B 2235/425* (2013.01); *C04B 2235/522* (2013.01); *Y02B 10/10* (2013.01); *Y02B 10/12* (2013.01); *Y02E 10/52* (2013.01); *Y02E 10/541* (2013.01); *Y02P 70/521* (2015.11); *Y10T 29/49355* (2015.01); *Y10T 29/49629* (2015.01)

(56) References Cited

U.S. PATENT DOCUMENTS

| | | | | |
|---|---|---|---|---|
| 4,184,942 | A * | 1/1980 | Angier et al. | 208/44 |
| 4,208,267 | A * | 6/1980 | Diefendorf et al. | 208/22 |
| 4,331,620 | A | 5/1982 | Diefendorf et al. | |
| 4,341,621 | A * | 7/1982 | Fitzgerald | D01F 9/145 208/45 |
| 4,443,324 | A | 4/1984 | Diefendorf et al. | |
| 4,465,586 | A | 8/1984 | Diefendorf et al. | |
| 4,528,087 | A * | 7/1985 | Shibatani | D01F 9/145 208/22 |
| 4,923,648 | A | 5/1990 | Hara | |
| 5,225,070 | A * | 7/1993 | Cornec et al. | 208/44 |
| 5,259,947 | A | 11/1993 | Kalback et al. | |
| 5,676,766 | A | 10/1997 | Probst et al. | |
| 6,121,540 | A * | 9/2000 | Takeda et al. | 136/244 |
| 6,303,096 | B1 | 10/2001 | Yamamoto | |
| 6,331,672 | B1 | 12/2001 | Matsuda | |
| 6,334,895 | B1 | 1/2002 | Bland | |
| 7,632,701 | B2 | 12/2009 | Dhere et al. | |
| 7,900,413 | B2 | 3/2011 | Stanley | |
| 2001/0054435 | A1 | 12/2001 | Nagao | |
| 2007/0066171 | A1* | 3/2007 | Bystricky et al. | 442/186 |
| 2007/0186971 | A1 | 8/2007 | Lochun et al. | |
| 2009/0020149 | A1 | 1/2009 | Woods et al. | |
| 2009/0078313 | A1 | 3/2009 | Basol | |
| 2009/0151847 | A1* | 6/2009 | Zhamu et al. | 156/47 |
| 2009/0269511 | A1 | 10/2009 | Zhamu et al. | |
| 2010/0065389 | A1 | 3/2010 | Gilboy | |
| 2010/0249726 | A1 | 9/2010 | Al-Rasheed | |
| 2010/0297835 | A1 | 11/2010 | Chuang et al. | |

FOREIGN PATENT DOCUMENTS

| | | |
|---|---|---|
| JP | H1036677 A | 2/1998 |
| JP | H1171190 A | 3/1999 |
| JP | 200275359 A | 3/2002 |
| WO | 200102632 A1 | 1/2001 |
| WO | 2009061685 A1 | 5/2009 |

OTHER PUBLICATIONS de Castro, Anisotropy and Mesophase Formation Towards Carbon Fibre Production from Coal Tar and Petroleum Pitches, Journal of Brazilian Chemical Society, 2006, vol. 17:6, pp. 1096-1108.*
"Thermal emittance", http://en.wikipedia.org/wiki/thermal_emittance. 1 page, printed May 6, 2012.
"Radiation Control Fact Sheet", http://www.oml.gov/sci/roofs+walls/facts/SolarRadiationControl.htm. pp. 1-8, printed May 6, 2012.
Akbari, H., et al., "ASTM Standards for Measuring Solar Reflectance and Infrared Emittance of Construction Materials and Comparing their Steady-State Surface Temperatures", ASTM Standards for Measuring Solar Reflectance and Infrared Emittance of Construction Materials, pp. 1.1-1.8, published Aug. 1996.
Parker, D.S., et al., "Laboratory Testing of the Reflectance Properties of Roofing Materials", Jul. 2000, Florida Solar Energy Center (FSEC), Cocoa, Florida, 13 pages.
Glass—Definition, "Definition of Glass", Merriam-Webster,[online], [retrieve on May 15, 2013]. Retrieved from the Internet: <URL: http://www.merriam-webster.com/dictionary/glass>, pp. 1-4.
Scheffler et al.,"Cellular Ceramics" Wiley-VCH Verlag Gmgh & Co. KGAA, Weinheim, 2005, pp. 146-150.
C. Chen, "Effect of Elemental Sulfur Properties of Pitch and Its Derived Coke," The American Carbon Society, Carbon Conference Archive, 2007 Proceedings, Seattle WA, Jul. 15-20, 2007. Retrieved from internet: http://acs.omnibooksonline.com/data/papers/2007_D041.pdf. 5 pages.
A.V. Kropachev et al., "Influence of Sulfur on Carbonization of Pitch Binders for Structural Carbon Composites," The American Carbon Society, Carbon Conference Archive, 2001 Proceedings, Lexington KY, Jul. 14-19, 2001. Retrieved from internet: http://acs.omnibooksonline.com/data/papers/2001_19.6.pdf. 6 Pages.
W. Chi et al., "Study on the Sulfur Modified Pitch for Matrix of C/C Composites," The American Carbon Society, Carbon Conference Archive, 2004 Proceedings, Brown University, Providence RI, Jul. 11-16, 2004. Retrieved from Internet: http://acs.omnibooksonline.com/data/papers/2004_M028.pdf. 7 pages.

* cited by examiner

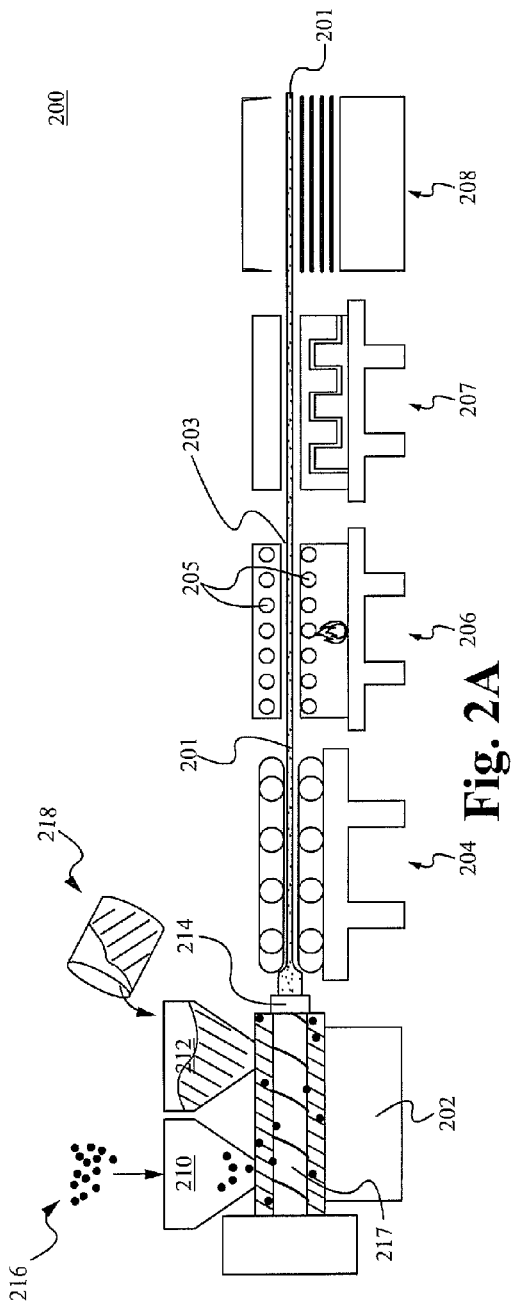
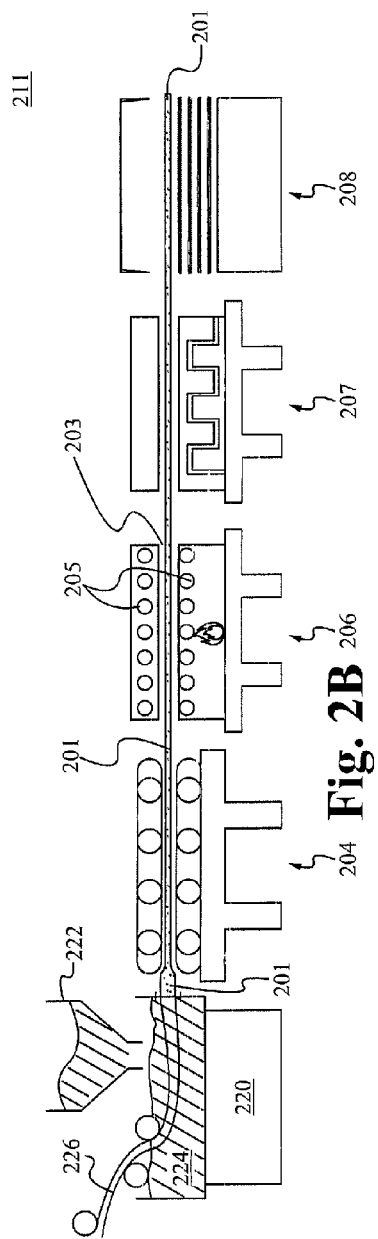

METHOD AND SUBSTRATES FOR MATERIAL APPLICATION

CROSS-REFERENCE TO RELATED APPLICATION

This application claims priority from U.S. Provisional Patent Application Ser. No. 61/455,060, filed Oct. 15, 2010 and entitled "NOVEL SUBSTRATES FOR MATERIALS APPLICATION," and U.S. Provisional Patent Application Ser. No. 61/455,061, filed Oct. 15, 2010 and entitled "NOVEL SUBSTRATES FOR PHOTO VOLTAIC APPLICATIONS," which are hereby incorporated herein by reference in their entirety for all purposes.

FIELD OF THE INVENTION

The present invention relates to the field of material science. More specifically, the present invention relates to the field of compositions for making novel materials.

BACKGROUND OF THE INVENTION

Typically, industrial wastes are unwanted and often left unused. In recent years, the rising of the awareness of environmental protection and energy conservation causes people to seek ways to better use resources and reduce wastes. Methods and strategies have been developed for waste management including waste prevention, waste minimisation, waste reuse, waste recycling, energy recovery, and waste disposal. Among the waste management methods and strategies, waste reuse is one of the attractive waste management methods, because it includes converting the unwanted waste to other useful products. Waste reuse is described as turning waste into gold. Thus, it is desirable to develop methods and devices for converting and incorporating the waste into useful products and materials.

SUMMARY OF THE INVENTION

A method of and an apparatus for making a composite material is provided. The composite is able to be formed by mixing a binder and a physical property enhancing material to form a mixer. The binder is able to be pitch, such as mesophase pitch. The physical property enhancing material is able to be fiber glass. The mixer is able to be processed through lamination process, stabilization/cross-link process, and carbonization. The composite material is able to be applied in the field of electronic components and green technology, such as a substrate of a photovoltaic cell.

In the first aspect, a method of manufacturing a composite material comprises selecting a first material to be added based on a selected material property of the composite material, coupling the first material with a binder material to form a mixture, and stabilizing or cross-linking the binder material, such that the composite material is formed.

In some embodiments, the binder material comprises pitch, coal ash, or a combination thereof. In other embodiments, the pitch comprises a mesophase pitch. In some other embodiments, the selected material property comprises conductivity or flexibility. In some embodiments, the first material comprises fiberglass. In other embodiments, the method further comprises forming a laminate. In some other embodiments, the method further comprises carbonizing the mixture. In some embodiments, the carbonizing comprises heating the mixture in a temperature above 700° C. In other embodiments, the method further comprises adding sulfur, organosulfur, organometallic compounds, nanoparticles of oxides or metals before stabilizing or cross-linking the binder material.

In the second aspect, a composite material comprises a laminate formed by pitch and a material property enhancing material. In some embodiments, the pitch comprises a mesophase pitch. In other embodiments, the pitch comprises a neomesophase pitch. In some other embodiments, the material property enhancing material comprises fiberglass, an oxide nanoparticle, a metal oxide, a metal nanoparticle, or a combination thereof. In some other embodiments, the material property enhancing material comprises conductors. In some embodiments, the conductors comprise a metal or an alloy. In other embodiments, the material property enhancing material comprises coal ash, milled glass, milled quartz, glass beads, glass fiber, quartz fiber, or a combination thereof. In some other embodiments, the material property enhancing material comprises an insulator.

In the third aspect, a method of forming a composite material comprises combining a fiberglass material with a binder material to form a mixture, laminating the mixture to form a laminate, stabilizing or cross-linking the binder material at a first temperature, and carbonizing the laminate at a second temperature.

In some embodiments, the binder material comprises a pitch. In other embodiments, the composite material comprises a conducting material forming a conducting layer coupling with a layer of material having conductivity lower than the conductivity of the conducting layer.

BRIEF DESCRIPTION OF THE DRAWINGS

FIGS. 2A and 2B illustrate apparatuses for making a substrate material in accordance with some embodiments.

DETAILED DESCRIPTION OF THE PREFERRED EMBODIMENT

In some aspects of the present invention, inexpensive and/or recycled industrial waste are used to make various materials. The materials have wide applications in industries. For example, the material is able to be used as part of the substrate of a photovoltaic cell. The industrial wastes that are used herein include pitch from the petrochemical industry and coal ash from the coal industry and coal fired electric generating plants. The above-mentioned waste products (such as pitch and coal ash) are able to be used as a substrate material for flexible and non-flexible thin film photovoltaic cells. Above listed industrial wastes are examples that are used for illustration purposes. Other industrial waste products are applicable.

In some other aspects of the present invention, materials and composite structures are formed using isotropic, anisotropic mesophase pitch, graphitizing pitch or liquid crystalline obtained from pitch (including commercially available pitch) as a binder or matrix material with other carbonaceous and or non-carbonaceous materials.

Figure 1:
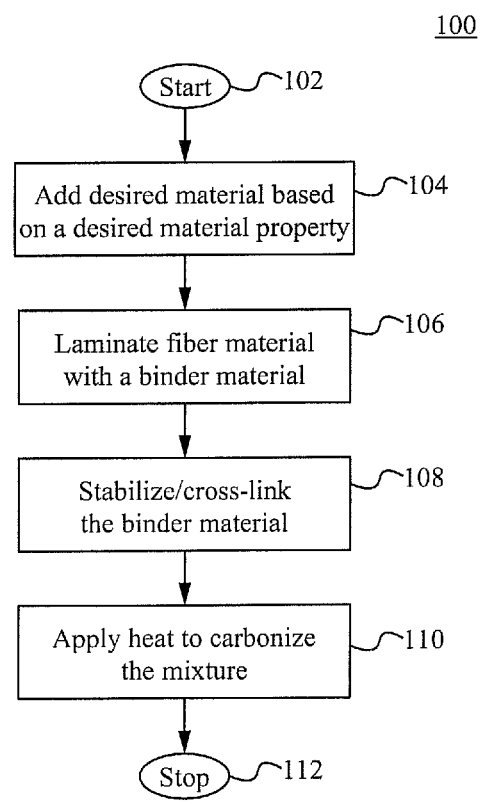
FIG. 1 illustrates a method of making a material in accordance with some embodiments.

In the following, methods of and apparatuses for making materials are disclosed in accordance with some embodiments. FIG. 1 illustrates a method 100 of making the materials in accordance with some embodiments. The method 100 is able to include adding desired/pre-selected materials, creating a laminate with the added materials, stabilizing and/or cross-linking a binder material, and carbonizing. The steps of method 100 are optional. Additional steps are able to be added to the method 100. The sequences of performing the steps of method 100 are able to be in any order. More details of performing method 100 are illustrated below. The method 100 is able to begin from Step 102.

At Step 104, selected materials/components are added based on a selected material property of the material. In some embodiments, woven fiberglass material (silica-based and/or carbon-based material) is impregnated with a binder material by spraying, roll-coating, dipping, brushing, or a combination thereof. The fiberglass material combined with the binder material forms a binder material coated fiberglass material. A person of ordinary skill in the art appreciates that other methods are able to be used to combine the binder material and the added material to gain predetermined physical interactions and properties, such as mixing, blending, and pressing. In other embodiments, non-woven fiber glass material is used to be combined with the binder material. The binder material described herein is able to be pitches, coal ash, or any other materials that are able to be used as a binder material. A person of ordinary skill in the art appreciates that the binder material is able to be any materials that have property of adhesion, such as adhesives, glues, cement, and paints. The property of adhesion includes materials that show such property under pre-defined conditions, such as temperature, pressure, solvent, co-reactants, or a combination thereof. For example, a binder material is within the scope of the present invention when the binder material demonstrates the property of adhesion under a pressure, such as 10 psi, and not adhesive under normal atmospheric pressure (e.g., 1 atm). Various other components are able to be added at Step 104 based on the pre-selected property of the products. Some of the embodiments are discussed in the following paragraphs.

At Step 106, a laminate including the added material is created. In some embodiments, the above formed binder material coated fiberglass material is rolled or extruded to form a laminate. In some embodiments, the thickness of the laminate is thinner than 20 microns. In some other embodiments, the thickness of the laminate is thicker than 2000 microns. In some other embodiments, the thickness of the laminate is between 20 microns and 2000 microns. In some embodiments, the width of the laminate is in the range between 10 cm and 1 m, such that a sheet of a laminate material is able to be made for further cutting. In some other embodiments, the width of the laminate is in the range between 0.5 cm and 3 cm, such that a cell/rectangular form of a substrate is formed for ready-to-use. A person of ordinary skill in the art would appreciate that any width of the laminate is applicable depending on a selected use of the substrate.

In some embodiments, the laminate includes a structure having a mesophase pitch layer sandwiched by layers of fiber glass on the top side and on the bottom side of the mesophase pitch layer. For example, a sandwich structure/laminate is formed by preparing a first layer of fiber glass sheet having a size of 1 m$^2$ and a thickness of 3 mm, adding a second layer of a binder material (such as a mesophase pitch) having a size of 1 m$^2$ and a thickness of 5 mm on top of the first layer, adding a third layer of fiber glass sheet having a size of 1 m$^2$ and a thickness of 2 mm, and extruding with a pressure press extruder to form a sandwiched laminate having a thickness of 7 mm. In other embodiments, the laminate includes a layer of fiber glass sandwiched by two layers of pitch. In some embodiments, the pitch is a low molecular weight neomesophase pitch or is any other binder.

At Step 108, the binder material is stabilized or cross-linked below the softening temperature in an oxygen ambient to form a treated material. In some embodiments, the temperature is in the range of 200° C. to 450° C. A person of ordinary skill in the art appreciates that other temperature ranges are applicable. In some embodiments, the temperature is near the softening temperature. In some other embodiments, the temperature is higher than the softening temperature.

At Step 110, the treated material is heat treated to carbonize the mixture. In some embodiments, the temperature of Step 110 is in the range of 800° C. to 1700° C. In some other embodiments, the temperature is in the range of 700° C. to 3000° C. In some embodiments, the Step 110 is performed under inert ambient, such as nitrogen, with a pressure between 2 psi and 40 psi. In some embodiments, the pressure applied is maintained during the cooling down step, such that shrinkage and warpage of the sheet structure is able to be minimized. The method 100 is able to stop at Step 112.

Different material properties are selected for different applications, such as thermal, sound, electrical, vibrational, signal, and light conductivity/insulation, material strength, and material durability. Various materials are able to be added in the composite material to enhance the pre-determined property. In some embodiments, chopped or particulate conducting materials are used as the reinforcing agent or material, such that the conductivity of the material produced is able to be enhanced. In some other embodiments, chopped or particulate non-conducting materials are used as the reinforcing agent or material, such that the property of insulation of the material produced is enhanced. In some embodiments, the materials that are incorporated include coal ash, milled glass, milled quartz, glass beads, chopped glass fiber, chopped quartz fiber mica flakes, ceramic powder/beads/flakes, and non-carbonaceous material. In some other embodiments, the materials that are incorporated include conducting metallic or metal alloy powders, flakes or fibers. In some embodiments, the materials that are incorporated include nanoparticles, such as metal nanoparticles and metal oxide nanoparticles (e.g., $Cr_2O_3$ nanoparticles are incorporated as a catalyst for neucleation.) A person of ordinary skill in the art appreciates that any conducting materials are able to be added including copper, chromium, carbon powder or carbon flakes, graphite flakes, or combinations thereof.

In some embodiments, the electrical resistivity of the substrate material (the material produced from the method 100) is selected. In some embodiments, an amount of less than 5% of sulfur or organo-sulfur compounds with or without metallic oxides or metallic compounds is admixed into the mesophase pitch binder before the cross-linking step such that glassy carbon is formed during the high temperature carbonization step. Any other materials that are able to be added to, for example, control the texture or strength and increase or decrease the resistivity of the substrate materials are within the scope of the present invention.

In the following, the apparatuses for making the substrate material are disclosed. FIGS. 2A and 2B illustrate apparatuses 200 and 211 for making the substrate material in accordance with some embodiments. The reactants, such as the fiber glass 216 and binder materials 218, are able to be added in the mixing device 202 through the hopper 210 and 212, respectively. The reactants are able to be in solid and/or liquid form of solvent and/or compositions. In some embodiments, the mixing device 202 is able to be an extruder. The mixing device 202 is able to mix the materials added by the mixer 217, such as a screw mixer. A person of ordinary skill in the art appreciates that any number of hoppers are able to be included in the mixing device 202. The mixing device 202 and/or the apparatus 200 are able to be performed under air atmosphere, inter atmosphere (such as $N_2$ and Ar), or pressurized atmosphere (such as 2-10 psi and 1-3 atm). The hoppers 210 and 212 are able to be hermetically sealed chambers, top open chambers, hinged top opening chambers for solid and fluids, such as gas, liquid, and supercritical fluids. The mixing device 202 is able to include a die 214 allowing the output material 201 to be shaped in a desired form and thickness, such as 1 mm-10 mm. In some embodiments, the apparatus 200 is able to include a roller 204, such as a pull roller. The roller 204 is able to use its rolling wheels and belts compressing the output material 201 to a desired thickness, such as 20 to 500 microns. The laminate described in FIG. 1 is able to be fabricated in a batch mode or roll-to-roll depending on the thickness of the laminate using the mixing device 202 and/or the roller 204 described herein. The output material 201 is able to be heated in the oven 206 in a pre-determined temperature, such as 200° C.-450° C. for stabilizing or cross-linking the binder material and 600° C.-1700° C. for carbonizing the materials. In some embodiments, during the stabilization and carbonization steps, a controlled fluid ambient is used to exact the pressure on both major sides of the substrate. For example, the oven/furnace 206 is able to be lined with tiny orifices 205 (with multiple heating zones), where the gap between the upper and the lower inner furnace walls is negligible compared to the width or length of the furnace. In some embodiments, inert gas is introduced into the oven/furnace 206 in the carbonizing process through the tiny orifices 205 on both side of the laminate in the oven/furnace 206 and the pressure of the fluid is controlled to emanate on both sides of the laminate (output material 201), such that the fluid, such as inert gas, prevents the sheet laminate from touching the major sides of the oven/furnace 206. In some embodiments, the gap of the fluid exit 203 of the oven 206 is reduced, such that the applied fluid is able to be used to exact the pressure on the substrate during the cross-linking, carbonization, or a combination thereof. In some embodiments, the apparatus 200 is able to include one or more cooling device 207. The output material 201 is able to be cut and stored by a cutter 208 to a pre-determined dimension, such as 1 $m^2$. The cutter 208 is able to be a pressure press-cut machine.

Similar to the protrusion setup device 202, FIG. 2B shows a pultrusion device 220. The pultrusion device 220 is able to continuously manufacture composite materials. A fiber sheet 226 is able to be pulled through the pitch bath 224, which is supplied by a pitch source 222. The output material 201 in FIG. 2B is able to be further compressed by the roller 204, heated by the over 206, cooling down by the cooler 207, and sized by the cutter 208 similar to the processes described in FIG. 2A and its associated texts.

Applications

The materials that are made by using the methods and apparatuses disclosed herein in accordance with some embodiments are able to be applied in various applications and used in various ways. For example, in some embodiments, more than one laminate is able to be stacked and bonded by a thin layer of mesophase pitch binder. The orientation of the sheets is able to be parallel to each another, cross-ply, or in any selected orientations with respect to each other prior to the cross-linking step. The single sheet or stacked sheets are able to be cut and formed in a suitable mold by known methods for fabricating a pre-selected structure or shape, such as a substrate of a solar cell.

In some embodiments, an alternatively conductive layer structure is selected, which is able to be made by bonding the highly conductive laminates to each other by using the more insulative glassy carbon binder. The formed material having alternative layers of different conductivity is able to be used as a capacitor for low or high temperature applications. For example, the capacitor is able to have a structure including a first layer of highly insulating layer, a second layer of conducting layer, a third layer of highly insulating layer, a fourth layer of conducting layer, and a fifth layer of highly insulating layer. The substrate made through the methods and apparatuses disclosed herein is able to be used as flexible substrate for photovoltaic cells, electromagnetic shielding, casing for electronic appliances and architectural applications.

Photo Voltaic Cells

In the following, methods of making photovoltaic cells (PV) using the material/substrate made above are provided in accordance with embodiments.

Traditionally, sodalime glass and stainless steel sheets are used for the fabrication of thin film solar cells. Problems are associated with the photovoltaic cells that use sodalime glass or stainless steel sheets as substrates. The sodalime glass substrates are brittle, which increases the probability of defects to the substrates and failures to the PV cells. Furthermore, the sodalime glass substrate is rigid and not flexible, which limits its applications to only flat surfaces. Moreover, the sodalime glass substrate is an electrical insulator and is expensive, which is about 40% of PV fabrication cost. Additionally, the Tg (glass transition temperature) of sodalime glass substrate limits the selenization temperature. Comparing the typical PV cell with a rolled stainless steel sheet as a substrate with the PV cell with sodalime glass as a substrate, the rolled stainless steel sheet substrate has a more flexible and conductive structure than the sodalime glass substrate. Nonetheless, the rolled stainless steel substrate is inferior than the sodalime glass substrate in a way that the stainless steel substrate has a rougher surface. Moreover, the metal contained in the typical stainless steel substrate is able to be a source of metallic contamination (such as Fe, Ni, and Se) to CIGS semiconductors, because the metals contained (such as Fe, Ni, and liquid Se) is able to diffuse through Mo grain boundaries to short the cell. Especially, the typical selenization temperature under inert atmosphere is between 500° C. and 750° C. At such temperature, the diffusion rate of Fe and Ni becomes very fast and the kinetics favors Fe diffusion through the open grain boundary between Mo grains. Also, at this high temperature, molten Se in the CIS (copper indium selenide) or CIGS (Copper indium gallium (di)selenide: a tetrahedrally bonded semiconductor) layer above the Mo diffuses through the Mo grain boundaries to attack the stainless substrate beneath the Mo, shorting out the solar cells. These defects typically result in cells with greatly reduced efficiencies and the substrates are often scrapped. High scrap loses and accompanying low efficiency cells produces expensive solar cells, which are not commercially viable.

In the following, methods of making photovoltaic cells (PV) using the material/substrate made above are provided in accordance with embodiments.

Methods of and substances for making photovoltaic cells in accordance with some embodiments are disclosed. In some embodiments, the photovoltaic cells include a composite or a non-composite carbonaceous substrate, in which isotopic or anisotropic mesophase pitch, neomesophase pitch, or a combination thereof is used as a binder, matrix material, or the neat material for the fabrication of planar and non planar sheets for the fabrication of thin film solar cells. In the following, a photovoltaic cell having a substrate using the material disclosed herein is provided in accordance with some embodiments.

Figure 3:
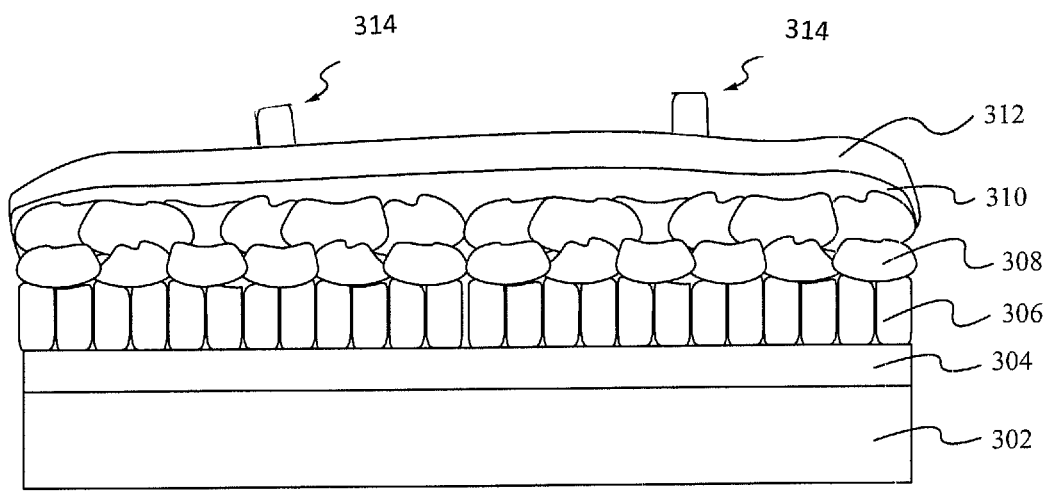
FIG. 3 illustrates a photovoltaic cell in accordance with some embodiments.

FIG. 3 illustrates a photovoltaic cell 300 in accordance with some embodiments. In some embodiments, the photovoltaic cell 300 includes a substrate 302, an adhesive layer 304, a Mo layer 306, an absorber layer 308, a buffer layer 310 (such as a CdS layer), and TCO (transparent conduction oxide) layer 312. The substrate 302 of the photovoltaic cell 300 is able to include a mesophase/neomesophase pitch backbone substrate. In some embodiments, the thickness of the substrate 302 is able to be 20 microns to 1 mm or more. In some other embodiments, the thickness of the substrate 302 is able to be thicker than 5 mm. A person of ordinary skill in the art appreciates that any thickness of the substrate 302 is applicable. The physical and material properties of the substrate 302 is adjustable by adding pre-selected fillers based on the applications. The rigidity/flexibility, conductivity, the degree of thermal expansion, and surface roughness for the substrate 302 are all adjustable and controllable. For example, a conductive substrate 302 is able to be made by adding conductive materials, catalysts, nanoparticles, and metallic oxides (e.g., a filler) to the binder material during the manufacturing process. When an insulating substrate 302 is desired, the insulating substrate is able to be made by adding insulating materials to the binder material during the manufacturing process. Similarly, a flexible substrate 302 is able to be made by adjusting the hardness or stiffness of the binder materials or the types of materials to be added. The substrate 302 made using the methods and materials disclosed herein is able to withstand a higher selenization temperature range than the substrate made by typical methods. Since the substrate 302 made using the methods and materials disclosed herein has minimal to no undesirable metallic impurities, short of the cell is able to be avoided when heating the photovoltaic cell under a high temperature.

In some embodiments, the photovoltaic cell 300 includes an adhesive layer 304. The adhesive layer 304 is able to be a Cr layer and applied on top of the substrate 302 by sputtering and other known methods. The thickness of the adhesive layer 304 is able be between 20 nm to 1000 nm. A person of ordinary skill in the art appreciates that any thickness of the adhesive layer 304 is applicable, such as 2 mm or thicker.

In some embodiments, the photovoltaic cell 300 includes a Mo layer 306. The Mo layer 306 is able to be on top of the adhesive layer 304. The Mo layer 306 is able to serve as the back contact and to reflect most unabsorbed light back into the absorber layer 308 (such as a CIGS layer). The Mo layer 306 is able to be a thin film deposited by PVD (physical vapor deposition) such as sputtering and evaporation and other known methods, such as CVD (chemical vapor deposition). The thickness of the Mo layer 306 is able to be between 100 nm to 2000 nm. A person of ordinary skill in the art appreciates that any thickness of the Mo layer 306 is applicable, such as 2 microns or thicker. In some embodiments, multiple Mo layers 306 are able to be included to attain a pre-defined Mo film thickness. In some embodiments, a thin layer Mo alloy (such as a 2 nm to 10 nm MoSi layer) is inserted within the Mo laminate to modify the grain structure of the Mo film coated over the alloy layer.

In some embodiments, the photovoltaic cell 300 includes an absorber layer 308, such as CIGS layer or a CIG/CIS layer. The absorber layer 308 is able to be formed by depositing/sputtering/evaporating precursor materials/layers, such as Cu, In, Ga, or a combination thereof on the Mo layer 306 followed by selenization. The absorber is able to be formed using typical methods of forming CIGS layers. In some embodiments, the precursor materials/layers are able to be coated with a thin layer of sodium fluoride prior to the selenization step in inert ambient between the temperature of 500° C. and 800° C. for 5 minutes to 120 minutes in excess selenium ambient, such as $H_2Se$ or $Se_{(g)}$.

In some embodiments, the photovoltaic cell 300 includes a buffer layer 310. The buffer layer 310 is able to be n-type CdS. The buffer layer is able to be coated on the absorber layer 308 by typical methods. In some embodiments, the photovoltaic cell 300 includes a transparent conducting oxide layer (TCO) 312. The TCO layer 312 is able to be doped with Al. The TCO layer is able to collect and move electrons out of the cell while absorbing as little light as possible. In some embodiments, the photovoltaic cell 300 includes electrical wiring elements 314 on the TCO layer 312 for conducting electronic signals and electricity. In some embodiments, the photovoltaic cell 300 is able to be laminated with polymer films to form flexible solar cells.

Figure 4:
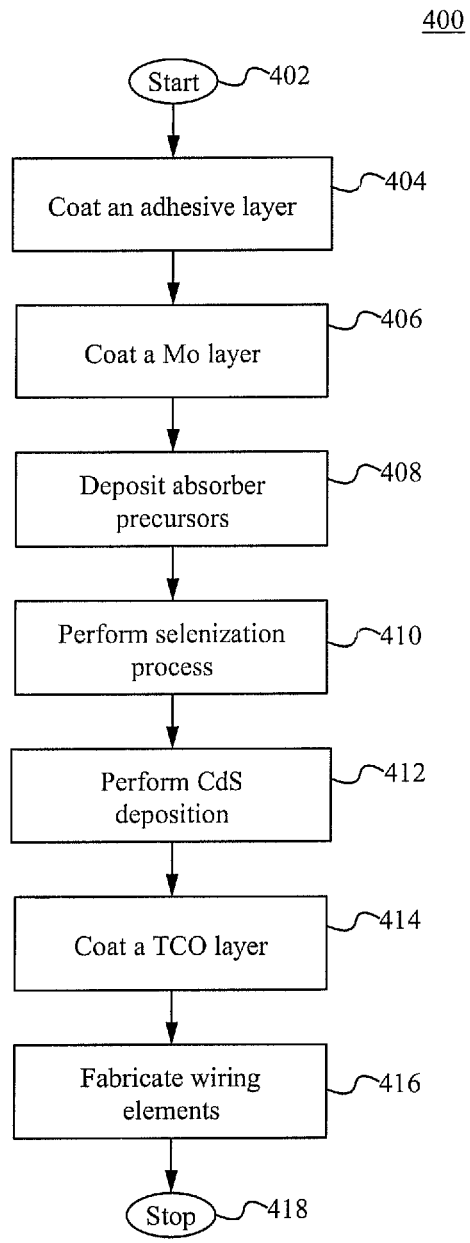
FIG. 4 illustrates a photovoltaic cell manufacturing method in accordance with some embodiments.

FIG. 4 illustrates a photovoltaic cell manufacturing method 400 in accordance with some embodiments. The method 400 is able to begin from Step 402. At Step 404, an adhesive layer is coated on a substrate. The substrate is able to be manufactured using the method described above. In some embodiments, the adhesive layer contains Cr or a Cr sheet/layer. In some embodiments, the substrate is a mesophase matrix substrate. The mesophase matrix substrate is able to be a bottom electrode of the photovoltaic cell. In some other embodiments, the substrate is a composite carbonaceous substrate. In other embodiments, the substrate is a non-composite carbonaceous substrate. The substrate is able to be isotropic or anisotropic mesophase pitch, neomesophase pitch, or a combination thereof. A person of ordinary skill in the art appreciates that other materials that are adhesive or adhesive under predetermined conditions are applicable. At Step 406, a Mo layer is coated on the adhesive layer, which is able to couple the substrate with an absorber layer. At Step 408, precursor materials, such as Cu, In, Ga, and Se (Copper indium gallium selenide), are coated on the Mo layer. At Step 410, selenization is performed. In the process of selenization, Se is able to be supplied in the gas phase (for example as $H_2Se$ or elemental Se) at high temperatures, and the Se becomes incorporated into the film by absorption and subsequent diffusion. By performing the selenization, an absorber of the photovoltaic cell is able to be formed. At Step 412, CdS layer formation on the absorber (CIGS) layer is performed. At Step 414, a layer of TCO is coated on the CdS layer. At Step 416, wiring elements are fabricated on the TCO. The method 400 is able to stop at Step 418. In the following, a method of forming the mesophase pitch sheet that is able to be used as the substrate in the method 400 described above is provided.

Figure 5:
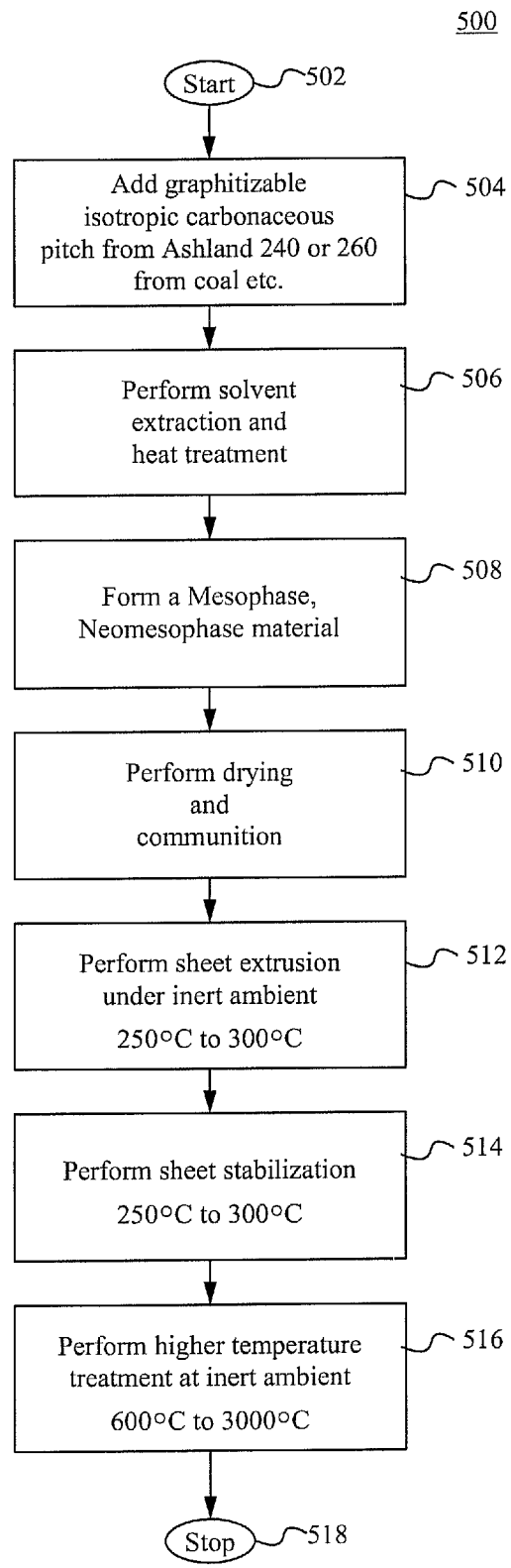
FIG. 5 illustrates a mesophase pitch sheet fabrication method in accordance with some embodiments.

FIG. 5 illustrates a mesophase pitch sheet fabrication method 500 in accordance with some embodiments. The method 500 begins from Step 502. At Step 504, a pitch is added. The pitch is able to be graphitizable isotropic carbonaceous pitch from Ashland 240 or 260 (petroleum pitch) from coal. A person of ordinary skill in the art appreciates that the pitch is able to be from various sources, such as directly from industrial waste. At Step 506, solvent extraction and heat treatment is performed with the pitch. At Step 508, mesophase or neomesophase materials are formed. In some embodiments, the mesophase or neomesophase materials contain liquid crystals more than 50% of the composition. At Step 510, the mesophase or neomesophase materials are dried and communition is performed. At Step 512, sheet extrusion is performed under inter ambient atmosphere at 250° C. to 300° C. At Step 514, sheet stabilization is perform by heating the sheet at 250° C. to 300° C. At Step 516, high temperature treatment is performed at inert ambient at 600° C. to 3000° C. The method 500 is able to stop at Step 518. In the following, a method of incorporating filler materials into the substrate material/mesophase sheet material is provided.

Figure 6:
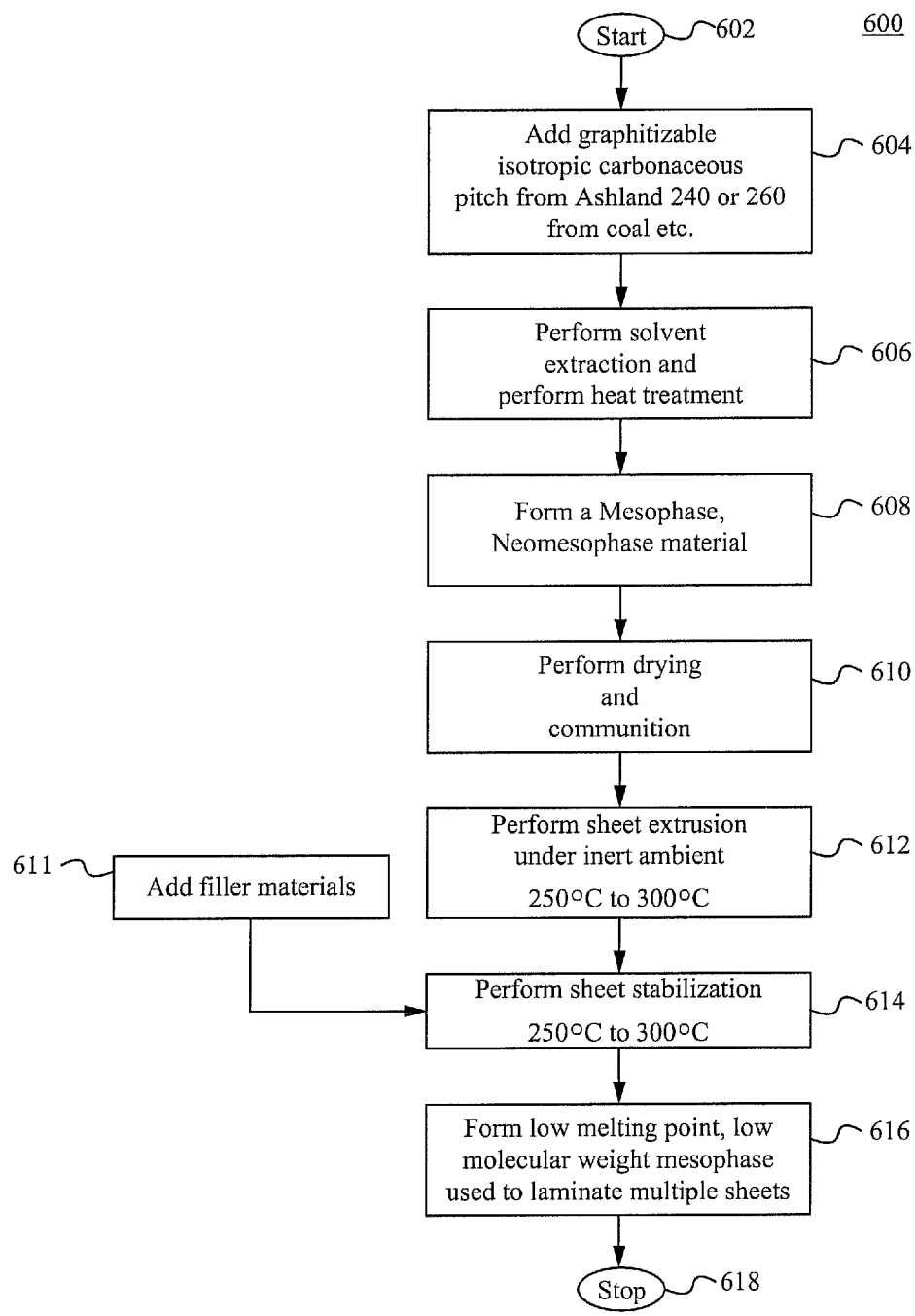
FIG. 6 illustrates a mesophase pitch sheet fabrication method in accordance with some embodiments.

FIG. 6 illustrates a mesophase pitch sheet fabrication method 600 in accordance with some embodiments. The method 600 begins from Step 602. At Step 604, a pitch is added. The pitch is able to be graphitizable isotropic carbonaceous pitch from Ashland 240 or 260 (petroleum pitch) from coal. A person of ordinary skill in the art appreciates that the pitch is able to be from various sources, such as directly from industrial waste. At Step 606, solvent extraction and heat treatment is performed. At Step 608, mesophase or neomesophase materials are formed. In some embodiments, the mesophase or neomesophase materials contain liquid crystals more than 50% of the composition. At Step 610, the mesophase or neomesophase materials are dried and communition is performed. At Step 611, filler material is added. The filler to be added is able to be chosen based on the pre-selected physical/chemical property of the substrate (product). At Step 612, sheet extrusion is performed under inter ambient atmosphere at 250° C. to 300° C. At Step 614, sheet stabilization is performed by heating the sheet at 250° C. to 300° C. At Step 616, low melting point and/or low molecular weight mesophase pitch is formed, which is able to be used to laminate multiple sheet material. The method 600 is able to stop at Step 618.

All steps described above are optional. The sequence of performing the steps that are included in the methods above is able to be in any order. Additional steps are able to be added.

The present application is able to be utilized in making various materials for industrial applications, such as the substrate of a solar cell. In operation, a photovoltaic solar cell with a flexible substrate made with the methods provided herein is able to be bent to a desired shape and applies on a non-flat surface.

The term pitch used herein is able to include tar, asphaltene, viscoelastic polymers, asphalt, bitumen, carbon disulfide, and resin. In some embodiments, the high viscosity of the chosen binder (such as pitch) or the added material provides a function to retain the metallic particles in the substrate and prevent them from shorting the PV cell. In some embodiments, the materials/substrates made using the methods and compositions disclosed herein is able to be used as a heat insulation device, like thermal paint, which is able to be installed on/apply on or as a part of the roof or wall of a building structure, such as a house or a barn. In some embodiments, the materials/substrates comprise conductive material having high electrical conductivity, so the materials/substrates are able to be used to conduct electricity. In some other embodiments, the materials/substrates have high reflectivity of heat and/or lights, and the substrates and the materials are able to be used as minors on building structures. The minors described herein are able to reflect/insulate/isolate heat, lights, or a combination thereof. In some embodiments, the substrates/materials are able to reflect more than 90% of the incoming lights or selected wavelengths of lights, such as IR and UV.

The present invention has been described in terms of specific embodiments incorporating details to facilitate the understanding of principles of construction and operation of the invention. Such reference herein to specific embodiments and details thereof is not intended to limit the scope of the claims appended hereto. It will be readily apparent to one skilled in the art that other various modifications may be made in the embodiment chosen for illustration without departing from the spirit and scope of the invention as defined by the claims.

What is claimed is:

1. A composite material comprising a first conductive laminate and a second conductive laminate, wherein the first conductive laminate is formed by a mesophase pitch layer comprising a mesophase stabilized or cross-linked pitch combined with a reinforcement layer comprising a material property enhancing material, wherein the mesophase pitch layer has a composition containing liquid crystals more than 50% of the composition, wherein the second conductive laminate is bonded to the first conductive laminate by an insulative layer, wherein the first conductive laminate, the insulative layer, and the second conductive laminate form the composite material having alternating conductive layers, wherein the insulative layer comprises an insulative glassy carbon binder.

2. The composite material of claim 1, wherein the material property enhancing material comprises fiberglass, an oxide nanoparticle, a metal oxide, a metal nanoparticle, or a combination thereof.

3. The composite material of claim 1, wherein the material property enhancing material comprises conductors.

4. The composite material of claim 3, wherein the conductors comprise a metal or an alloy.

5. The composite material of claim 1, wherein the material property enhancing material comprises coal ash, milled glass, milled quartz, glass beads, glass fiber, quartz fiber, or a combination thereof.

6. The composite material of claim 1, wherein the material property enhancing material comprises an insulator.

7. The composite material of claim 1, further comprising less than 5% of a sulfur or organo-sulfur compound in the composite material.

8. The composite material of claim 1, wherein the composite material has a reflectivity of heat, lights, or both.

9. A laminate composite material comprising:
a. an insulative layer comprising an insulative glassy carbon binder;
b. a first conductive laminate, which is formed by a mesophase pitch layer comprising a mesophase stabilized or cross-linked pitch combined with a reinforcement layer comprising a material property enhancing material; and
c. a second conductive laminate, wherein the first conductive laminate, the insulative glassy carbon binder, and the second conductive laminate form the laminate composite material having alternating conductive layers.

10. A photovoltaic cell comprising:
I) a laminate composite material substrate having:
a. an insulative layer;
b. a first conductive laminate formed by a mesophase pitch layer comprising a mesophase pitch combined with a material property enhancing material, and a second conductive laminate, wherein the first conductive laminate, the insulative layer, and the second conductive laminate form the composite material having alternating conductive layers; and II) a photovoltaic absorber layer supported by the laminate composite material substrate.

11. a composite material comprising a laminate of alternating conductive layers formed by
   a mesophase pitch layer comprising a mesophase stabilized or cross-linked pitch combined with a reinforcement material comprising a material property enhancing material;
   a insulative glassy carbon binder; and
   a conductive layer, wherein the mesophase pitch layer has a composition containing liquid crystals more than 50%, wherein the mesophase stabilized or cross-linked pitch comprises a heterogeneous mixture having an amount of isotropic pitch and is insulative.

12. The composite material of claim 11, wherein the composite material has a reflectivity of heat, lights, or both.

* * * * *